United States Patent
Chen

(10) Patent No.: US 11,626,864 B1
(45) Date of Patent: Apr. 11, 2023

(54) LEVEL SHIFT CIRCUIT

(71) Applicant: MACRONIX INTERNATIONAL CO., LTD., Hsinchu (TW)

(72) Inventor: Chung-Kuang Chen, Hsinchu (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 0 days.

(21) Appl. No.: 17/545,942

(22) Filed: Dec. 8, 2021

(51) Int. Cl.
H03K 19/0175 (2006.01)
H03K 19/0185 (2006.01)
G11C 7/00 (2006.01)
H03K 3/356 (2006.01)

(52) U.S. Cl.
CPC . H03K 3/356113 (2013.01); H03K 3/356182 (2013.01); H03K 19/018521 (2013.01)

(58) Field of Classification Search
None
See application file for complete search history.

(56) References Cited

U.S. PATENT DOCUMENTS

| | | | | |
|---|---|---|---|---|
| 4,532,439 A * | 7/1985 | Koike | ............ | H03K 19/09485 365/182 |
| 4,675,544 A * | 6/1987 | Schrenk | ........... | H03K 19/09485 326/121 |
| 4,697,101 A * | 9/1987 | Iwahashi | ................ | G11C 16/30 326/88 |
| 5,065,361 A * | 11/1991 | Yoshizawa | ............. | G11C 16/08 365/185.23 |
| 5,359,243 A * | 10/1994 | Norman | ......... | H03K 19/018521 326/65 |
| 7,272,046 B2 * | 9/2007 | Tanzawa | ................ | G11C 16/12 365/189.11 |
| 8,446,784 B2 | 5/2013 | Tanzawa | | |
| 8,599,614 B2 | 12/2013 | Miida et al. | | |
| 8,638,618 B2 | 1/2014 | Hung et al. | | |
| 8,705,273 B2 | 4/2014 | Kim et al. | | |
| 9,147,489 B2 * | 9/2015 | Kim | ...................... | G11C 16/30 |
| 9,589,642 B2 | 3/2017 | Chang et al. | | |
| 10,482,966 B2 | 11/2019 | Chiang et al. | | |
| 2013/0194020 A1 | 8/2013 | Shen et al. | | |

OTHER PUBLICATIONS

UC Berkeley Lecture "The MOS Field Effect Transistor n-channel MOSFET Layout" EECS 105 Microelectronic Devices and Circuits, Oct. 2000, pp. 1-36—downloaded from https://inst.eecs.berkeley.edu/~ee105/fa00/lectures/Lectw5.PDF.

* cited by examiner

Primary Examiner — Kenneth B Wells
(74) Attorney, Agent, or Firm — Andrew L. Dunlap; Haynes Beffel & Wolfeld LLP

(57) ABSTRACT

A level shifter circuit to convert a first signal having an input voltage range V1 to a level shifted output having an output voltage range V2 includes an NMOS depletion mode transistor having a drain terminal connected to an output range upper-level supply node, a source connected to an intermediate node and a gate connected to an output node, a PMOS enhancement mode transistor having a drain terminal connected to the output node, a source connected to the intermediate node and a gate connected to an input node, and an NMOS enhancement mode transistor having a drain terminal connected to the output node, a source connected to an output range lower-level supply node and a gate connected to the input node.

20 Claims, 3 Drawing Sheets

US 11,626,864 B1

LEVEL SHIFT CIRCUIT

BACKGROUND

Field

The present disclosure relates to level shifter circuits that boost voltage range of an input signal to a higher voltage range signal.

Description of Related Art

In a variety of electronic devices, control signals are generated using a first lower power supply voltage and then shifted to a second higher power supply voltage. The level shifted control signal can then be applied to high voltage circuits. Level shifter circuits can include a number of transistors and thus large require significant layout area. See, for example, U.S. Pat. No. 8,638,618, by Hung, et al., issued Jan. 28, 2014. The problem of large layout area is amplified particularly in devices that utilize many level shifter circuits. It is desirable to provide a level shifter circuit that requires smaller layout area but can operate over large shifts in voltage.

SUMMARY

A compact level shifter circuit is described. In an embodiment, the level shifter circuit is configured for connection to a first signal having an input voltage range V1 with input range upper and lower levels (e.g. VDD and VSS), to produce a level shifted output having an output voltage range V2 with output range upper and lower levels (e.g. HV and VSS), the output voltage range being greater than the input voltage range. The circuit can comprise an NMOS depletion mode transistor having a drain terminal connected to an output range upper-level supply node, a source connected to an intermediate node and a gate connected to an output node; a PMOS enhancement mode transistor having a drain terminal connected to the output node, a source connected to the intermediate node and a gate connected to a first node; and an NMOS enhancement mode transistor having a drain terminal connected to the output node, a source connected to an output range lower-level supply node and a gate connected to the first node.

In embodiments described herein, the NMOS depletion mode transistor has a first threshold voltage and the PMOS enhancement transistor has a second threshold voltage, and the first threshold voltage is more negative than (i.e., less than) the second threshold voltage, and a sum of the input range upper level and the first threshold voltage is less negative than (i.e., greater than) the second threshold voltage.

In an embodiment described herein, the level shifter circuit includes a second NMOS depletion mode transistor having a drain terminal connected to an output range upper-level supply node, a source connected to the intermediate node and a gate connected to a complement of the first signal. In this embodiment, the NMOS depletion mode transistor has a first threshold voltage, the PMOS enhancement transistor has a second threshold voltage, and the second NMOS depletion mode transistor has a third threshold voltage, and wherein the third threshold voltage plus the input range upper level is less negative than the second threshold voltage, and the second threshold voltage is less negative than the third threshold voltage minus the input range upper level.

Other aspects and advantages of the present invention can be seen on review of the drawings, the detailed description and the claims, which follow.

DETAILED DESCRIPTION

A detailed description of embodiments of the present technology is provided with reference to the FIGS. 1-6.

Figure 1:
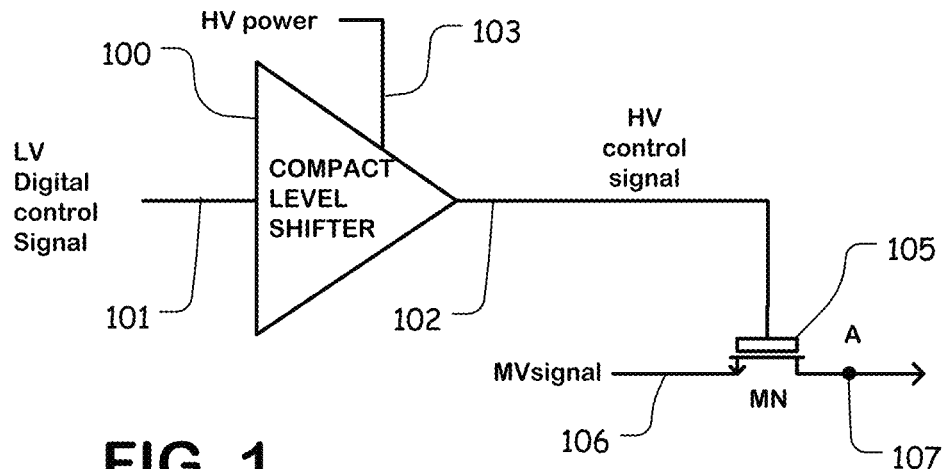
FIG. 1 is a simplified diagram of an electronic device that includes a compact level shifter as described herein.

FIG. 1 is a simplified diagram of an electronic device that includes a compact level shifter 100. A low voltage LV digital control signal is received on line 101 having an input voltage range established using a relatively lower voltage power supply (e.g., VDD). A high voltage power supply (HV Power) is applied on line 103 to the compact level shifter 100. The compact level shifter 100 outputs a high voltage HV control signal on line 102 established using the high voltage power supply.

In this example, the electronic device applies the high voltage control signal on line 102 to the gate of transistor 105, which is used to transfer a mid level voltage MV signal to node A on line 107. This configuration can be used for an example in which node A is coupled to a word line as a word line driver circuit, an example of which is described in U.S. Pat. No. 8,638,618, by Hung, et al., which is incorporated by reference as if fully set forth herein.

Figure 2:
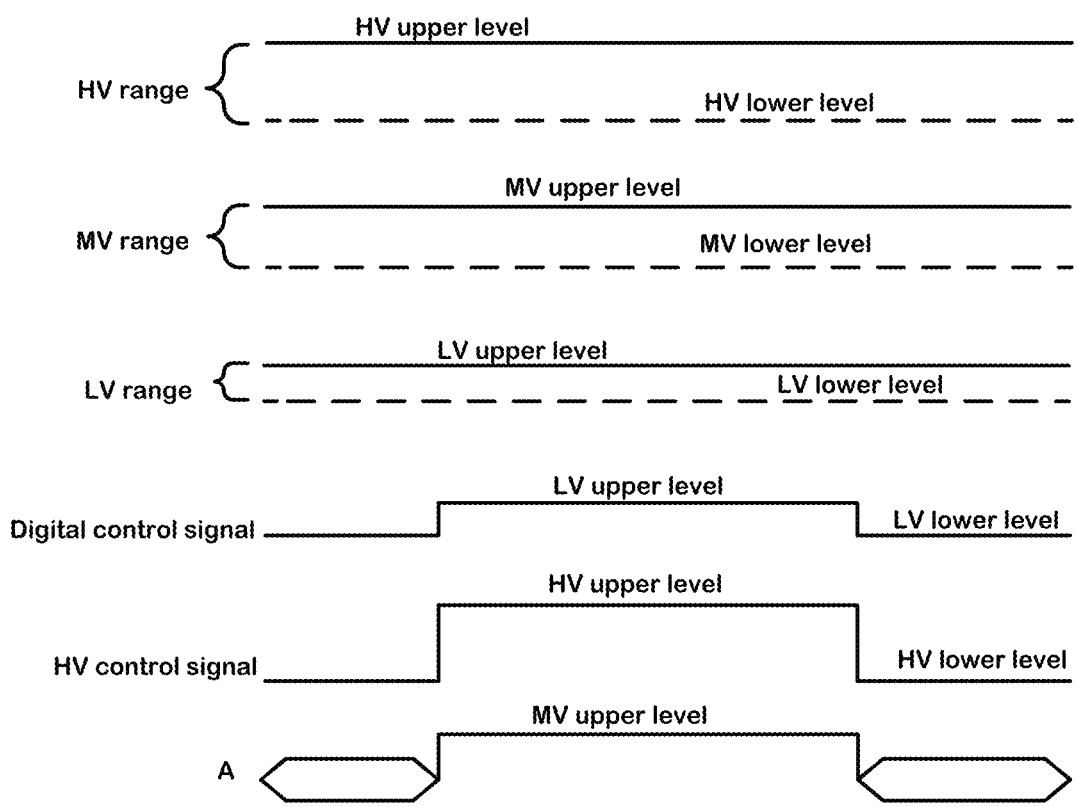
FIG. 2 is a graph showing voltage levels for the circuit of FIG. 1.

FIG. 2 is a chart of voltage levels for the circuit of FIG. 1. In the circuit, there are signals with three voltage ranges labeled HV range, MV range and LV range in FIG. 2. As illustrated, the HV range has a high voltage range upper level which can be, for two examples, 16 V or 32 V. Also, the HV range has a low voltage range lower level which can be for example ground or 0 V. In some embodiments, the low voltage range lower voltage can be other values, such as a negative voltage. The difference between the high voltage range upper level and the high voltage range lower level is referred to as the high voltage range. In these two examples, where the high voltage range lower level is ground, the high voltage range can be 16 or 32 V. Embodiments of the compact level shifter described herein can operate with other high voltage ranges, including ranges that are even greater.

Also, the LV range has a low voltage range upper level which can be, for two examples, 5 V or 2.5 V. Also, the LV range has a low voltage range lower level which can be for example ground or 0 V. In some embodiments, the low voltage range lower voltage can be other values, such as a negative voltage. The difference between the low voltage range upper level and the low voltage range lower level is referred to as the low voltage range. In these two examples, where the low voltage range lower level is ground, the low voltage range can be 5 or 2.5 V.

Embodiments of the compact level shifter described herein can operate with low voltage ranges that are even smaller, such as less than 2.5 V, for example 2.3 V, and less than 1.5 V, for example 1.2 V.

FIG. 2 also illustrates the middle voltage range, having a middle voltage upper level and a middle voltage lower level. In the example illustrated in FIG. 1, a high voltage control signal on line 102 must be high enough to turn on the transistor 105 in order to pass the middle voltage signal on line 106 to node A. Thus, it must be at least the threshold voltage of transistor 105 higher than the middle voltage signal.

In operation, a digital control signal is input on line 101 and changes from the lower level to the upper level as illustrated. In response, the high voltage control signal changes from the lower level to the upper level as illustrated. When the high voltage control signal changes to the upper level, then node A also changes to the middle voltage upper level. When the digital control signal changes from the upper level to the lower level, the high voltage control signal likewise changes to its lower level, and the transistor 105 turns off.

Figure 3:
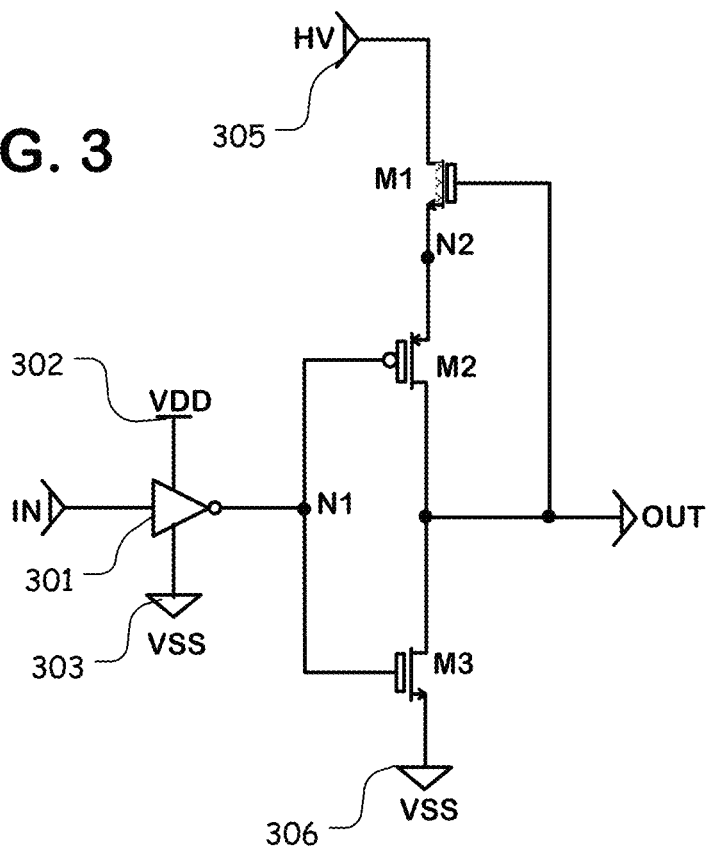
FIG. 3 schematic diagram of a compact level shifter as described herein.

FIG. 3 is a schematic diagram of a compact level shifter circuit. In this example, an input signal IN is applied as an input to an inverter 301 which is coupled to a lower range upper-level supply node VDD 302 and a lower range lower-level supply node VSS 303. An output of the inverter 301 is a first signal applied to first node N1.

The circuit includes a first NMOS depletion mode transistor M1, a first PMOS enhancement mode transistor M2 and a first NMOS enhancement mode transistor M3. The first NMOS depletion mode transistor M1 has a drain terminal connected to an output range upper-level supply node 305, a source connected to an intermediate node N2 and a gate connected to an output node OUT. The first PMOS enhancement mode transistor M2 has a drain terminal connected to the output node OUT, a source connected to the intermediate node N2 and a gate connected to the node N1. The NMOS enhancement mode transistor M3 has a drain terminal connected to the output node OUT, a source connected to an output range lower-level supply node 306 to receive VSS, and a gate connected to the node N1.

The first NMOS depletion mode transistor M1 has a negative threshold voltage Vthn_M1, such that the difference between the voltage on the output node OUT and a voltage on the node N2 must be equal to or greater than (less negative than) Vthn_M1 for transistor M1 to turn on.

The first PMOS enhancement mode transistor M2 has a negative threshold voltage Vthp_M2, such that the difference between the voltage on the first node N1 and a voltage on the node N2 must be less than (more negative than) Vthp_M2 for transistor M2 to turn on. In embodiments of level shifters described herein, the threshold voltage Vthp_M2 of transistor M2 is greater than (less negative than, or having a smaller absolute value than) the threshold voltage Vthn_M1 of transistor M1.

The first NMOS enhancement mode transistor M3 has a positive threshold voltage Vthn_M3, such that the difference between the voltage on the first node N1 and the lower-level supply voltage VSS must be equal to or greater than (more positive than) Vthn_M3 for transistor M3 to turn on.

In various embodiments, the lower-level supply nodes 303, 306 are connected to a VSS, which can be DC ground or other DC voltage reference. In other embodiments the lower-level supply nodes 303, 306 can be connected to a VSS equal to AC ground. In other embodiments the lower-level supply nodes 303, 306 can be connected to a VSS equal to a negative voltage. In the embodiment illustrated, the lower-level supply nodes 303 and 306 are coupled to a ground or 0 V reference, or otherwise have the same voltage level.

Figure 4:
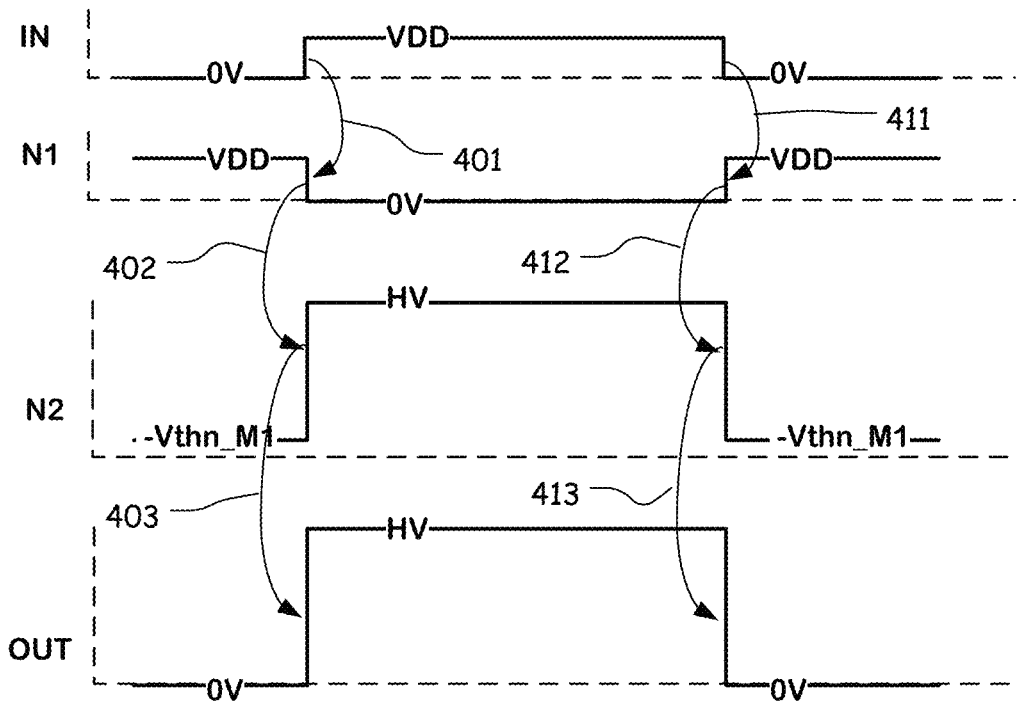
FIG. 4 is a timing diagram for the circuit of FIG. 3.

FIG. 4 is a timing diagram illustrating operation of the circuit of FIG. 3. In FIG. 4, a first trace illustrates the signal on the input signal IN. A second trace illustrates a signal on the first node N1. A third trace illustrates a signal on the intermediate, second node N2. A fourth trace illustrates a signal on the output node OUT. In operation, a change of the input signal from the input range lower level (0 V) to the input range upper level (VDD), causes 401 a change of the signal on the first node N1 from the input range upper level to the input range lower level. This change causes 402 the voltage on the intermediate node N2 to change from a lower level which is (−Vthn_M1) to the output range upper level (HV). This change causes 403 the output node OUT to change between the output range lower level and the output range upper level. On a change of the input signal from the input range upper level to the input range lower level, the complementary sequence of changes is induced, as illustrated by arrows 411, 412, 413.

In order for the change of the output node OUT from output range lower level to the output range higher level, when the voltage at node N1 changes to the input range lower level (0V), the transistor M3 must turn off, and the transistors M2 and M1 must turn on.

In order for transistor M2 to turn on, the voltage VN1 at node N1 minus the voltage VN2 at node N2 must be less than, or more negative, than Vthp_M2. For this change, the voltage at node N1 falls to input range lower level or zero volts. The voltage at node N2 is clamped at OUT−Vthn_M1, which is (−Vthn_M1) because the voltage at the output node OUT at the output range lower level is 0V. So in order for the transistor M2 to turn on, $$VN1-VN2<Vthp\_M2; \quad (1)$$

However, the voltage VN1 at node N1 is 0V and the voltage VN2 at node N2 is −Vthn_M1. So equation (1) resolves to:

$$Vthn\_M1<Vthp\_M2. \quad (2)$$

Likewise, in order for the change of the output node OUT from the output range upper level to the output range lower level, the transistor M3 must turn on, and the transistors M2 and M1 must turn off.

In order for transistor M2 to turn off, the voltage VN1 at node N1 minus the voltage VN2 at node N2 must be greater than, or less negative than, Vthp_M2. For this change, the voltage at node N1 rises to input range upper level or VDD volts. The voltage at node N2 starts at OUT−Vthn_M1, but OUT is pulled low when transistor M3 turns on, so that node N2 falls as well to a minimum of −Vthn_M1. So in order for the transistor M2 to turn off, $$VN1-VN2>Vthp\_M2; \quad (3)$$

However, the voltage VN1 at node N1 is VDD and the voltage VN2 at node N2 is falling to −Vthn_M1. So equation (1) resolves to:

$$VDD-(-Vthn\_M1)>Vthp\_M2. \quad (4)$$

Combining (2) and (4), a condition for the threshold voltages of transistors M1 and M2 is as follows:

$$VDD+Vthn\_M1>Vthp\_M2>Vthn\_M1 \quad (5)$$

Accordingly, in the circuit of FIG. 3, the threshold voltage Vthp_M2 must be less than (i.e. more negative than, with a higher absolute value) the sum of the input range upper level VDD and the threshold voltage Vthp_M1 of transistor M1, and greater than (i.e. less negative with a lower absolute value) the threshold voltage of transistor M1. The difference between VDD and the absolute value of Vthp_M1 provides a design window for operation. The threshold voltages of the transistors are tuned for example by adjusting the doping concentration of the channels of the transistors, or other structural features of the transistors during manufacturing.

The level shifter circuit of FIG. 3 therefore works when the threshold voltage of the transistor M2 is set according to equation (5).

For example, assuming VDD is 2.3 V, and Vthn_M1 is −3 V, the design window from Vthp_M2 is 0.7 V>Vthp_M2>−3V. Adding PMOS turn off margin w1 for low leakage current, and a turn-on margin w2 for transient speed, the design window becomes −(0.7+w1)>Vthp_M2>−(3−w2). In an example, w1 is about 1 V, and w2 is about 0.5 V. The design window narrows to the following: −1.7>Vthp_m2>−2.5 V, assuming VDD is 2.3 V.

However, as the input range falls below 2.3 V, the window narrows further. For example, with VDD equal to 1.2 V, the design window computation for the example above yields −2.8>Vthp_M2>−2.5 V, which cannot be met (because −2.8 is less than −2.5).

Figure 5:
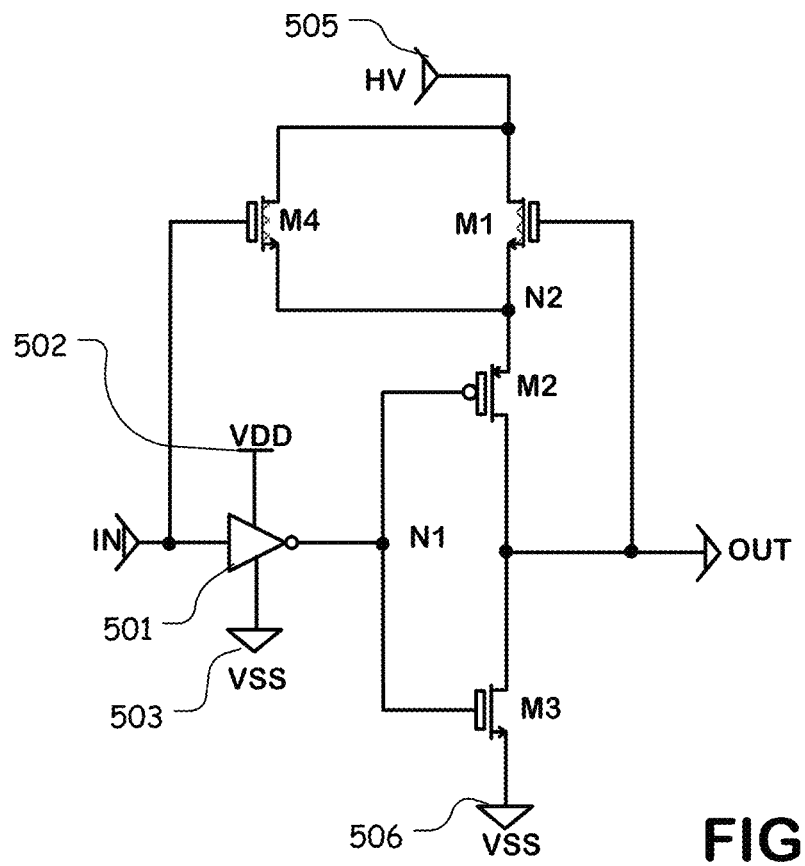
FIG. 5 is a schematic diagram of another embodiment of a compact level shifter as described herein.

FIG. 5 illustrates an embodiment suitable for use in which the input range falls below 1.5 V, to for example 1.2 V.

FIG. 5 is a schematic diagram of a compact level shifter circuit. In this example, an input signal IN is applied as an input to an inverter 501 which is coupled to a lower range upper-level supply node VDD 502 and a lower range lower-level supply node VSS 503. An output of the inverter 501 is applied to node N1.

The circuit includes a first NMOS depletion mode transistor M1, a first PMOS enhancement mode transistor M2, a first NMOS enhancement mode transistor M3, and a second NMOS depletion mode transistor M4. The first NMOS depletion mode transistor M1 has a drain terminal connected to an output range upper-level supply node 505, a source connected to an intermediate node N2 and a gate connected to an output node OUT. The first PMOS enhancement mode transistor M2 has a drain terminal connected to the output node OUT, a source connected to the intermediate node N2 and a gate connected to the node N1. The NMOS enhancement mode transistor M3 has a drain terminal connected to the output node OUT, a source connected to an output range lower-level supply node 506 to receive VSS, and a gate connected to the node N1.

The second NMOS depletion mode transistor M4 has a drain terminal connected to an output range upper-level supply node 505, a source connected to an intermediate node N2 and a gate connected to the input node IN.

The first NMOS depletion mode transistor M1 has a negative threshold voltage Vthn_M1, such that the difference between the voltage on the output node OUT and a voltage on the node N2 must be equal to or greater than (less negative than) Vthn_M1 for transistor M1 to turn on.

The first PMOS enhancement mode transistor M2 has a negative threshold voltage Vthp_M2, such that the difference between the voltage on the first node N1 and a voltage on the node N2 must be less than (more negative than) Vthp_M2 for transistor M2 to turn on.

The first NMOS enhancement mode transistor M3 has a positive threshold voltage Vthn_M3, such that the difference between the voltage on the first node N1 and the lower-level supply voltage VSS must be equal to or greater than (more positive than) Vthn_M3 for transistor M3 to turn on.

The second NMOS depletion mode transistor M4 has a negative threshold voltage Vthn_M4, such that the difference between the voltage on the input node IN and a voltage on the node N2 must be equal to or greater than (less negative than) Vthn_M4 for transistor M4 to turn on. In embodiments of the circuit, the first NMOS depletion mode transistor M1 and the second NMOS depletion mode transistor M4 have substantially the same threshold (Vthn_M4=Vthn_M1), because they are implemented with the same specified dimensions and same specified doping concentrations. In some embodiments, the first NMOS depletion mode transistor M1 and the second NMOS depletion mode transistor M4 have different threshold voltages. In operation, this second NMOS depletion mode transistor M4 operates to setup a higher voltage on node N2 when VIN goes high, during the change while the voltage on node OUT remains low and unable to pass a higher voltage through the first NMOS depletion mode transistor M1 to node N2.

In various embodiments, the lower-level supply nodes 503, 506 are connected to a VSS equal to DC ground or other DC voltage reference. In other embodiments the lower-level supply nodes 503, 506 can be connected to AC ground. In the embodiment illustrated, the lower-level supply nodes 503 and 506 are coupled to a ground or 0 V reference, or otherwise have the same voltage level. As mentioned above, the lower level supply nodes can be coupled to a negative voltage in some embodiments.

In order for the change of the output node OUT from output range lower level to the output range higher level when the voltage at node N1 changes to the input range lower level (0V), the transistor M3 must turn off, and the transistors M4, M2 and M1 must turn on.

In order for transistor M2 to turn on, the voltage VN1 at node N1 minus the voltage VN2 at node N2 must be less than, or more negative, than Vthp_M2. For this change, the voltage at node IN rises to input range upper level or VDD, and the voltage at node N1 falls to input range lower level or zero volts. The voltage at node N2 is clamped by M4 which receives the VDD more quickly than N2 rises to −Vthn_M4+VDD. So in order for the transistor M2 to turn on, $$VN1-VN2<Vthp\_M2; \quad (6)$$

However, the voltage VN1 at node N1 is 0V and the voltage VN2 at node N2 is −Vthn_M4+VDD. So equation (1) resolves to:

$$Vthn\_M4-VDD<Vthp\_M2. \quad (7)$$

Likewise, in order for the change of the output node OUT from the output range upper level to the output range lower level, the transistor M3 must turn on, and the transistors M4, M2 and M1 must turn off.

In order for transistor M2 to turn off, the voltage VN1 at node N1 minus the voltage VN2 at node N2 must be greater than, or less negative, than Vthp_M2. For this change, the voltage at node N1 rises to input range upper level or VDD, and the voltage at node IN falls to the input range lower level or 0V, turning off M4. The voltage at node N2 starts at HV, but OUT is pulled low when transistor M3 turns on, so that node N2 falls to a minimum of −Vthn_M1. So in order for the transistor M2 to turn off, $$VN1-VN2>Vthp\_M2; \quad (8)$$

However, the voltage VN1 at node N1 is VDD and the voltage VN2 at node N2 is falling to −Vthn_M1. So equation (1) resolves to:

$$VDD-(-Vthn\_M1)>Vthp\_M2. \quad (9)$$

Combining (7) and (9), and setting Vthn_M1=to Vthn_M4, a condition for the threshold voltages of transistors M1 and M2 is as follows:

$$VDD+Vthn\_M4>Vthp\_M2>Vthn\_M4-VDD. \quad (10)$$

Accordingly, in the circuit of FIG. 5, the threshold voltage Vthp_M2 must be less than (i.e. more negative than, with a higher absolute value) the sum of the input range upper level VDD and the threshold voltage Vthp_M4 of transistor M4, and greater than (i.e. less negative with a lower absolute value) the threshold voltage of transistor M4 minus the input range upper level VDD.

The level shifter circuit of FIG. 5 therefore works when the threshold voltage of the transistor M2 is set according to equation (10), for low input voltage ranges.

For example, assuming VDD is 2.3 V, and Vthn_M1 and Vthn_M4 are −3 V, the design window for Vthp_M2 is 0.7 V>Vthp_M2>−5.3V. Adding PMOS turn off margin w1 for low leakage current, and a turn on margin w2 for transient speed, the design window becomes −(0.7+w1)>Vthp_M2>−(5.3−w2). In an example, w1 is about 1 V, and w2 is about 0.5 V. The design window narrows to the following: −1.7>Vthp_m2>−4.8 V, assuming VDD is 2.3 V.

If VDD is reduced to 1.2 V, then the design window for Vthp_M2 is −1.8 V>Vthp_M2>−4.2 V. Adding PMOS turn-off margin w1 for low leakage current, and a turn-on margin w2 for transient speed, the design window becomes −(1.8+w1)>Vthp_M2>−(4.2−w2). In an example, w1 is about 1 V, and w2 is about 0.5 V. The design window narrows to the following: −2.8>Vthp_m2>−3.7 V. This example is based on Vthn_m1=−3V. The high and low boundaries for the threshold Vthp_M2 can be shifted with the thresholds Vthn_m4 and Vthn_M1.

Figure 6:
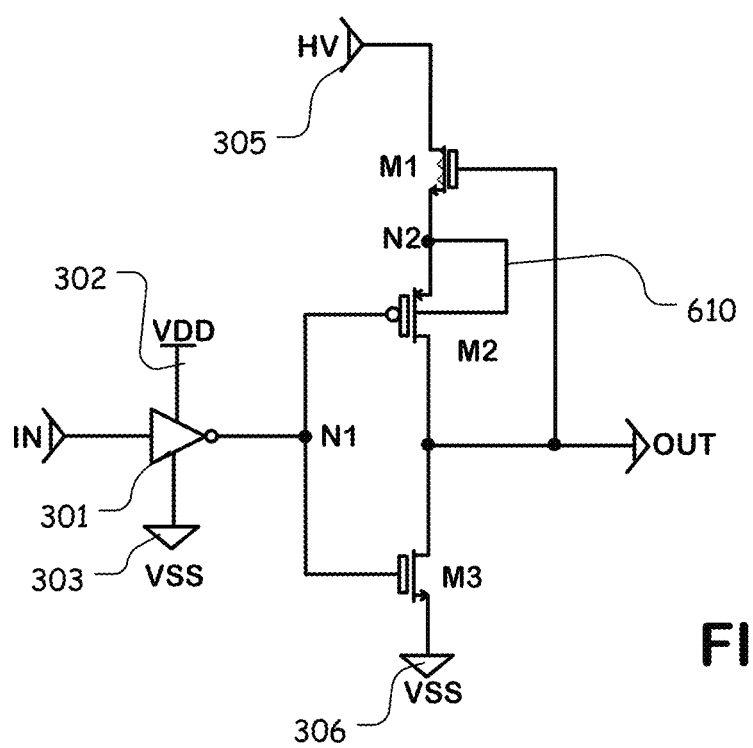
FIG. 6 is a schematic diagram of yet another embodiment of a compact level shifter as described herein.

FIG. 6 illustrates another embodiment like FIG. 3, and having the same reference numbers. FIG. 6 is different from FIG. 3 in that the transistor M2 is implemented with its source connected (610) to its channel body. This source to body connection can also be applied to transistor M4 in the circuit of FIG. 5. The source to body connection can impact the threshold voltages.

While the present invention is disclosed by reference to the preferred embodiments and examples detailed above, it is to be understood that these examples are intended in an illustrative rather than in a limiting sense. It is contemplated that modifications and combinations will readily occur to those skilled in the art, which modifications and combinations will be within the spirit of the invention and the scope of the following claims.

What is claimed is:

1. A level shifter circuit for connection to a first signal having an input voltage range with input range upper and lower levels, to produce a level shifted output having an output voltage range with output range upper and lower levels, the output voltage range being greater than the input voltage range, comprising:
    an NMOS depletion mode transistor having a drain terminal connected to an output range upper-level supply node, a source connected to an intermediate node and a gate connected to an output node;
    a PMOS enhancement mode transistor having a drain terminal connected to the output node, a source connected to the intermediate node and a gate connected to a first node that receives the first signal; and
    an NMOS enhancement mode transistor having a drain terminal connected to the output node, a source connected to an output range lower-level supply node and a gate connected to the first node,
    wherein the NMOS depletion mode transistor has a first threshold voltage, which is negative,
    wherein the PMOS enhancement mode transistor has a second threshold voltage, which is negative,
    wherein the first threshold voltage of the NMOS depletion mode transistor is more negative than the second threshold voltage of the PMOS enhancement mode transistor, and
    wherein a sum of (i) the input range upper level and (ii) the first threshold voltage is a negative value that is less negative than the second threshold voltage, which is negative and remains greater than the first threshold voltage.

2. The level shifter circuit of claim 1, wherein a sum of (i) the input range upper level, (ii) the first threshold voltage and a turn-off margin voltage of the PMOS enhancement mode transistor is a negative value that is less negative than the second threshold voltage, which is negative and remains greater than a sum of (i) the first threshold voltage and (ii) a negative turn-on margin voltage of the PMOS enhancement mode transistor.

3. The level shifter circuit of claim 1, wherein:
    on a change of the first signal at the input range upper level to the input range lower level, the intermediate node changes from a voltage of the output range lower level minus the first threshold voltage to the output range upper level, and the output voltage changes between the output range lower level and the output range upper level; and
    on a change of the first signal at the input range lower level to the input range upper level, the intermediate node changes from the output range upper level to the voltage of the output range lower level minus the first threshold voltage, and the output voltage changes from the output range upper level to the output range lower level.

4. The level shifter circuit of claim 1, wherein:
    on a change of the first signal at the input range upper level to the input range lower level, the NMOS depletion mode transistor switches from off to on, the PMOS enhancement mode transistor switches from off to on, and the NMOS enhancement mode transistor switches from on to off; and
    on a change of the first signal at the input range lower level to the input range upper level, the NMOS depletion mode transistor switches from on to off, the PMOS enhancement mode transistor switches from on to off, and the NMOS enhancement mode transistor switches from off to on.

5. The level shifter circuit of claim 1, further including a second NMOS depletion mode transistor having a drain terminal connected to the output range upper-level supply node, a source connected to the intermediate node and a gate connected to a complement of the first signal.

6. The level shifter circuit of claim 5, wherein the second NMOS depletion mode transistor has a third threshold voltage, and wherein the third threshold voltage plus the input range upper level is less negative than the second threshold voltage, and the second threshold voltage is less negative than the third threshold voltage minus the input range upper level.

7. The level shifter circuit of claim 6, wherein the first threshold voltage and the third threshold voltage are substantially the same voltage.

8. The level shifter circuit of claim 5, wherein:
    the second NMOS depletion mode transistor has a third threshold voltage;

on a change from the first signal at the input range upper level to the input range lower level, the intermediate node changes from a voltage of the output range lower level minus the first threshold voltage to a voltage of the input range upper level minus the third threshold voltage to the output range upper level, and the output voltage changes between the output range lower level and the output range upper level; and on a change from the first signal at the input range lower level to the input range upper level, the intermediate node changes from the output range upper level to the voltage of the output range lower level minus the first threshold voltage, and the output voltage changes from the output range upper level to the output range lower level.

9. The level shifter circuit of claim 5, wherein:

on a change from the first signal at the input range upper level to the input range lower level, the NMOS depletion mode transistor and the second NMOS depletion mode transistor switch from off to on, the PMOS enhancement mode transistor switches from off to on, and the NMOS enhancement mode transistor switches from on to off; and on a change from the first signal at the input range lower level to the input range upper level, the NMOS depletion mode transistor and the second NMOS depletion mode transistor switch from on to off, the PMOS enhancement mode transistor switches from on to off, and the NMOS enhancement mode transistor switches from off to on.

10. The level shifter circuit of claim 5, wherein the input voltage range is less than 1.5 V.

11. The level shifter circuit of claim 1, wherein the input voltage range is less than 2.5 V.

12. The level shifter circuit of claim 1, wherein the input voltage range is less than 2.5 V, and the output voltage range is greater than 15 V.

13. The level shifter circuit of claim 1, wherein the input voltage range is less than 2.5 V, and the output voltage range is greater than 25 V.

14. The level shifter circuit of claim 1, wherein the input range lower level and the output range lower level are the same voltage.

15. A level shifter circuit to produce a level shifted output having an output voltage range having output range upper and lower levels, the output voltage range being greater than an input voltage range having input range upper and lower levels, comprising:

an input gate having an input node for connection to an input signal to produce a first signal at a first node which is a complement of the input signal, having the input voltage range having the input range upper and lower levels;

an NMOS depletion mode transistor having a drain terminal connected to an output range upper-level supply node, a source connected to an intermediate node and a gate connected to an output node;

a PMOS enhancement mode transistor having a drain terminal connected to the output node, a source connected to the intermediate node and a gate connected to the first node; and an NMOS enhancement mode transistor having a drain terminal connected to the output node, a source connected to an output range lower-level supply node and a gate connected to the first node, wherein the NMOS depletion mode transistor has a first threshold voltage, which is negative, wherein the PMOS enhancement mode transistor has a second threshold voltage, which is negative, wherein the first threshold voltage of the NMOS depletion mode transistor is more negative than the second threshold voltage of the PMOS enhancement mode transistor, and wherein a sum of (i) the input range upper level and (ii) the first threshold voltage is a negative value that is less negative than the second threshold voltage, which is negative and remains greater than the first threshold voltage.

16. The level shifter circuit of claim 15, further including a second NMOS depletion mode transistor having a drain terminal connected to the output range upper-level supply node, a source connected to the intermediate node and a gate connected to the input signal.

17. The level shifter circuit of claim 16, wherein:

on a change from the first signal at the input range upper level to the input range lower level, the NMOS depletion mode transistor and the second NMOS depletion mode transistor switch from off to on; and on a change from the first signal at the input range lower level to the input range upper level, the NMOS depletion mode transistor and the second NMOS depletion mode transistor switch from on to off.

18. The level shifter circuit of claim 16, wherein the input voltage range is less than 1.5 V.

19. The level shifter circuit of claim 15, wherein the input voltage range is less than 2.5V, and the output voltage range is greater than 15 V.

20. The level shifter circuit of claim 15, wherein the input gate comprises an inverter.

* * * * *